(12) United States Patent
Furrer et al.

(10) Patent No.: US 9,633,687 B2
(45) Date of Patent: Apr. 25, 2017

(54) SYMBOL TIMING RECOVERY SCHEME FOR PARALLEL RECORDING CHANNEL SYSTEMS

(71) Applicant: International Business Machines Corporation, Armonk, NY (US)

(72) Inventors: Simeon Furrer, Altdorf (CH); Robert A. Hutchins, Tucson, AZ (US); Jens Jelitto, Rueschlikon (CH); Mark A. Lantz, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/985,255

(22) Filed: Dec. 30, 2015

(65) Prior Publication Data

US 2016/0365110 A1    Dec. 15, 2016

Related U.S. Application Data

(63) Continuation of application No. 14/735,317, filed on Jun. 10, 2015, now Pat. No. 9,251,811.

(51) Int. Cl.
*G11B 5/09* (2006.01)
*G11B 20/10* (2006.01)
(Continued)

(52) U.S. Cl.
CPC .... *G11B 20/10259* (2013.01); *G11B 5/00813* (2013.01); *G11B 5/29* (2013.01); *G11B 20/10037* (2013.01); *G11B 20/10046* (2013.01)

(58) Field of Classification Search
CPC ........... G11B 5/02; G11B 20/20; G11B 20/16; G11B 20/10; G11B 27/36; G11B 5/012;
(Continued)

(56) References Cited

U.S. PATENT DOCUMENTS 5,442,315 A    8/1995 Hutchins
6,046,878 A    4/2000 Liu et al.
(Continued)

OTHER PUBLICATIONS

Furrer et al., "Symbol Timing Recovery for Parallel Recording Channels with Low-SNR Operating Points," IBM Research-Zurich, May 5, 2014, pp. 1-18.
(Continued)

*Primary Examiner* — Nabil Hindi
(74) *Attorney, Agent, or Firm* — Zilka-Kotab, PC

(57) ABSTRACT

An apparatus includes a loop filter that receives a plurality of input signals. Each of the input signals is based on a different timing error detector output signal. The apparatus also includes a plurality of read channels, a plurality of interpolation filters, and an array of transducers. Each of the interpolation filters is in communication with a corresponding one of the read channels. Each of the transducers is in communication with a corresponding one of the read channels. The loop filter processes the plurality of input signals, and outputs a different total phase signal for each received input signal. Each of the interpolation filters samples the corresponding read channel based on one of the total phase signals output by the loop filter. The loop filter processes the plurality of input signals by calculating a phase estimate of the samples, and a skew estimate of the samples, relative to written data.

12 Claims, 9 Drawing Sheets

(51) Int. Cl.
*G11B 5/008* (2006.01)
*G11B 5/29* (2006.01)

(58) Field of Classification Search
CPC . G11B 2220/20; G11B 20/10009; G11B 5/09; G11B 5/56; G11B 5/584
USPC ... 360/21, 24, 26, 31, 39, 43, 55, 76, 42, 25
See application file for complete search history.

(56) References Cited

U.S. PATENT DOCUMENTS

| | | |
|---|---|---|
| 6,349,122 B1 | 2/2002 | Woodman, Jr. |
| 6,563,897 B1 | 5/2003 | Kitta |
| 7,773,326 B2 | 8/2010 | Hutchins et al. |
| 7,860,190 B2 | 12/2010 | Feller |
| 8,019,034 B2 | 9/2011 | Hutchins et al. |
| 8,094,768 B2 | 1/2012 | Tan |
| 9,251,811 B1 | 2/2016 | Furrer et al. |
| 9,557,385 B2 | 1/2017 | Furrer et al. |
| 2016/0363625 A1 | 12/2016 | Furrer et al. |

OTHER PUBLICATIONS

Olcer et al., "Compensation of PLL Loop Delay in Read Channels for Tape Storage Systems," IEEE Global Telecommunications Conference, Nov. 30-Dec. 4, 2009, pp. 1-5.
Olcer et al., "Global Timing Control with Applications to Tape Storage Channels," IEEE Global Telecommunications Conference, Nov. 30-Dec. 4, 2008, pp. 1-5.
Notice of Allowance from U.S. Appl. No. 14/735,317, dated Oct. 7, 2015.
Furrer et al., U.S. Appl. No. 14/735,317, filed Jun. 10, 2015.
Furrer et al., U.S. Appl. No. 14/985,286, filed Dec. 30, 2015.
List of IBM Patents or Patent Applications Treated As Related.
Notice of Allowance from U.S. Appl. No. 14/985,286, Sep. 20, 2016.

SYMBOL TIMING RECOVERY SCHEME FOR PARALLEL RECORDING CHANNEL SYSTEMS

BACKGROUND

The present invention relates to data storage systems, and more particularly, this invention relates to symbol timing recovery on magnetic media having parallel tracks that are written, and read, simultaneously.

In magnetic storage systems, magnetic transducers read data from and write data onto magnetic recording media. Data is written on the magnetic recording media by moving a magnetic recording transducer to a position on the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

In some instances of tape recording, multiple (e.g., 4, 8, 16, or more) parallel data tracks are written simultaneously onto magnetic media by means of a write module comprising an array of write elements/transducers. During a read operation, a read module comprising an array of magneto-resistive read elements/transducers simultaneously produces readback signals of the parallel written data tracks, from which parallel read channel circuitry detects/decodes the written data.

Symbol timing recovery (STR) during readback represents one of the most critical operations in read channels for data storage systems. Symbol timing recovery attempts to recover the optimum sampling time of an analog or digital waveform. A STR scheme typically includes, for each read channel, an interpolation filter, as well as a timing error detector, a loop filter, and controller that drives the interpolation filter. Generally, the timing error detector estimates residual error in a signal output from the interpolation filter, and the estimated residual error is used by the control loop to adjust a re-sampling time of the interpolation filter. The feedback loop encompassing the interpolation filter, the timing error detector, loop filter, and controller may also be referred to as a phase lock loop (PLL).

Sampling the analog readback signal at the right time instances (or re-sampling/interpolating the digital samples at the right time instances for the case of a digital implementation) is crucial to achieve good system performance. Challenges for STR include speed variations, skew variations, dropout events, and low SNR (signal-to-noise ratio).

A continuing goal in the data storage industry is that of increasing the density of data stored on media. For tape storage systems, that goal has led to increasing the track and linear bit density on recording tape, and decreasing the thickness of the magnetic tape medium. However, increasing the track and bit density on recording tape results in problems, such as decreased SNR.

The conventional approach for STR in tape systems employs independent second order PLLs per read channel, which are optimized for optimum noise rejection and minimum sampling jitter. Tape systems with classical STR schemes fail at low SNR due to high cycle slip rates. A cycle slip may occur when, during the parallel reading of a medium having multiple parallel channels, a timing estimate or timing-error estimate of one or more of the channels is noisy, and the timing erroneously advances by a full bit length, causing a bit of information to be lost. A cycle slip may also occur when, during the parallel reading of a medium having multiple parallel channels, a timing estimate or timing error of one or more of the channels is noisy, and timing retreats by a full bit length, causing a bit to be erroneously inserted.

BRIEF SUMMARY

In one general embodiment, an apparatus includes a loop filter that receives a plurality of input signals. Each of the input signals is based on a different timing error detector output signal. The apparatus also includes a plurality of read channels, a plurality of interpolation filters, and an array of transducers. Each of the interpolation filters is in communication with a corresponding one of the read channels. Each of the transducers is in communication with a corresponding one of the read channels. The loop filter processes the plurality of input signals, and outputs a different total phase signal for each received input signal. Each of the interpolation filters samples the corresponding read channel based on one of the total phase signals output by the loop filter. The loop filter processes the plurality of input signals by calculating a phase estimate of the samples, and a skew estimate of the samples, relative to written data. Such an apparatus may experience a reduced rate of cycle slips on one or more of the read channels relative to prior art systems.

Any of the embodiments may be implemented in a magnetic data storage system such as a tape drive system, which may include an array of transducer elements, a drive mechanism for passing a magnetic medium (e.g., recording tape) over the array of transducer elements, and a controller electrically coupled to the array of transducer elements.

Other aspects and embodiments of the present invention will become apparent from the following detailed description, which, when taken in conjunction with the drawings, illustrate by way of example the principles of the invention.

DETAILED DESCRIPTION

Figure 1A:
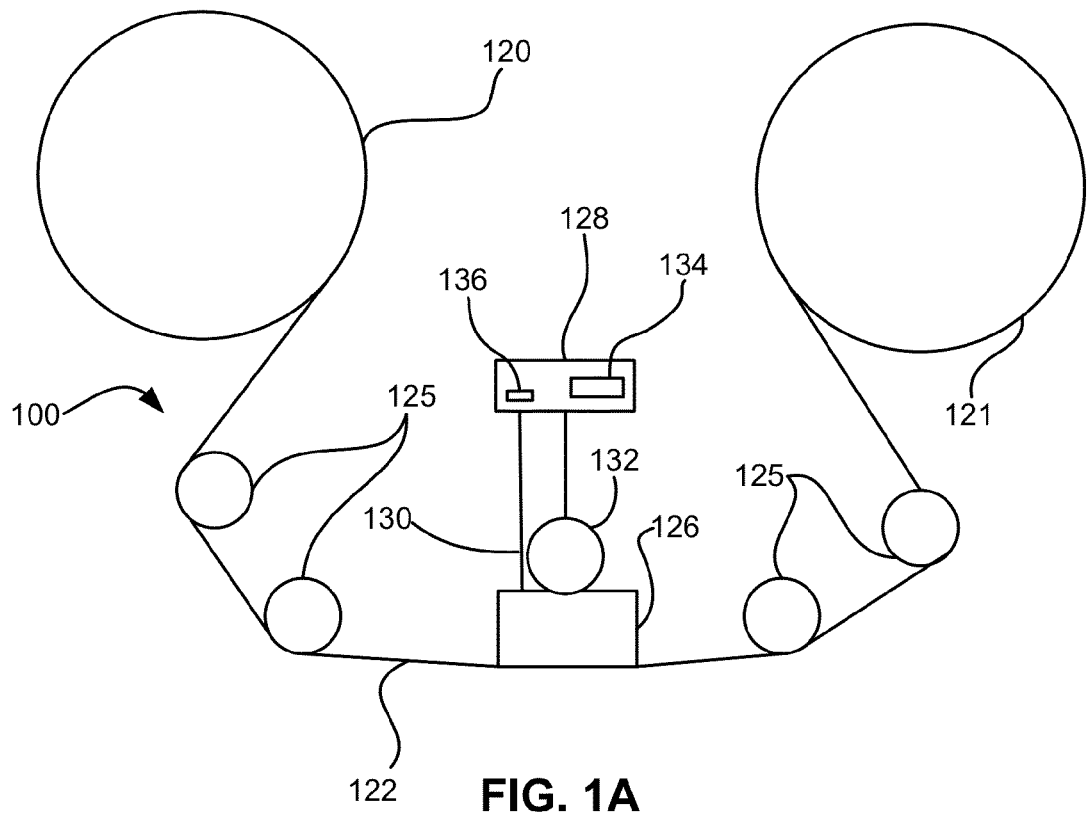
FIG. 1A is a schematic diagram of a simplified tape drive system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, a tape-based data storage system includes a plurality of timing error detectors, where each of the timing error detectors outputs a corresponding timing error detector output signal. The system also includes a loop filter in communication with the plurality of timing error detectors. The loop filter receives a plurality of input signals, wherein each of the input signals is based on a different one of the timing error detector output signals. Further, the system includes a plurality of read channels and a plurality of interpolation filters, where each of the interpolation filters is in communication with a corresponding one of the read channels. Still yet, the system includes an array of transducers, where each of the transducers is in communication with a corresponding one of the read channels. Additionally, the loop filter processes the plurality of input signals, and outputs a different total phase signal for each received input signal, and each of the interpolation filters samples the corresponding read channel based on one of the total phase signals output by the loop filter. Finally, the loop filter processes the plurality of input signals by calculating a phase estimate of the samples, and a skew estimate of the samples, relative to written data.

In another general embodiment, a method for symbol timing recovery comprises receiving a plurality of timing-error estimates for a plurality of read channels, where each of the timing-error estimates corresponds to one of the read channels. The method further comprises calculating a common phase based on the plurality of timing-error estimates, and calculating a skew of a transducer array based on the plurality of timing-error estimates. Finally, the method comprises calculating a different total phase estimate for each read channel based on the calculated common phase and the calculated skew of the transducer array.

In another general embodiment, a method for symbol timing recovery comprises receiving a plurality of timing-error estimates for a plurality of read channels, where each of the timing-error estimates corresponds to one of the read channels. The method also comprises generating a proportional gain for each of the read channels by weighting each of the timing-error estimates, and calculating a common phase based on the plurality of timing-error estimates. Additionally, the method comprises, for each read channel, calculating a channel-adjusted phase estimate for the read channel by combining the proportional gain for the read channel with the common phase. Moreover, the method comprises calculating a skew of a transducer array based on the plurality of timing-error estimates, and, for each read channel, calculating a total phase estimate for the read channel based on the channel-adjusted phase estimate for the read channel and the calculated skew of the transducer array.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of reader elements, writer elements, or both.

As used herein, a writer element may include any hardware device utilized to store a symbol, such as a bit, to a magnetic medium. Further, a reader element may include any hardware device utilized for detecting a symbol, such as a bit, stored to a magnetic medium, such as a read head.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
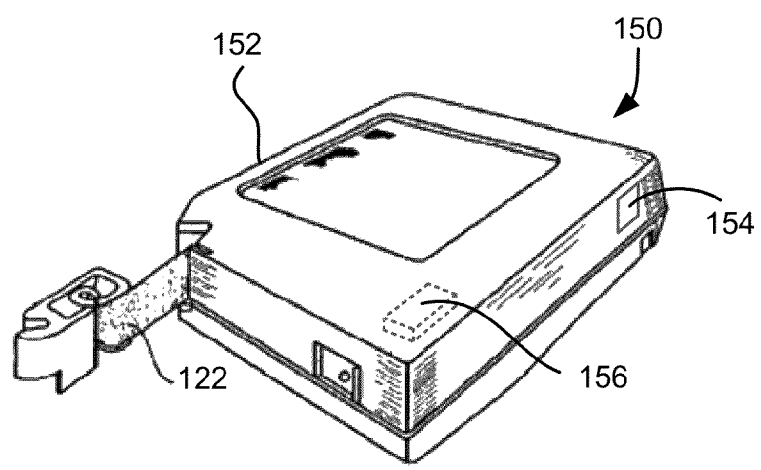
FIG. 1B is a schematic diagram of a tape cartridge, according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 2:
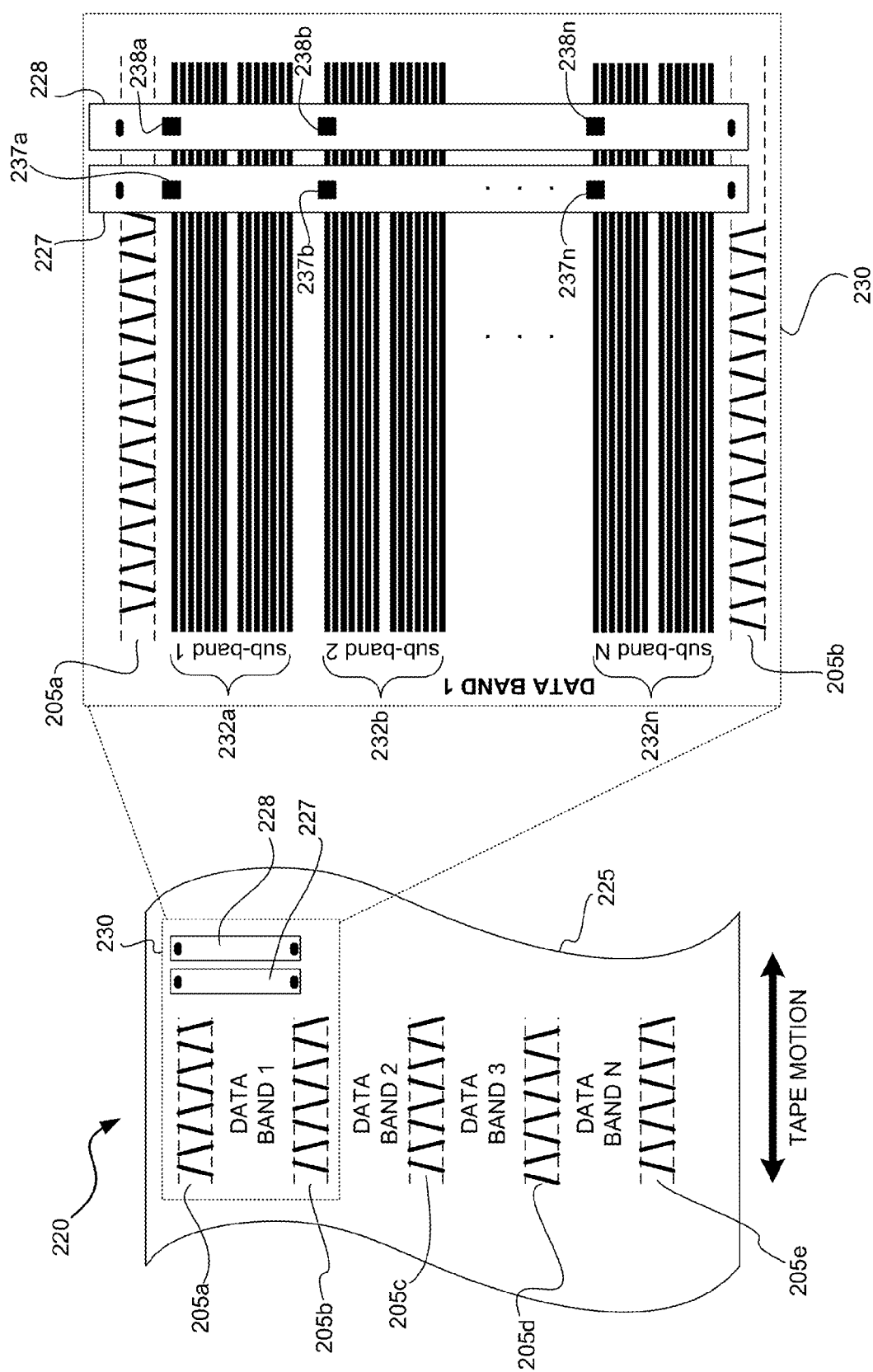
FIG. 2 illustrates a tape system, according to one embodiment.

FIG. 2 depicts a tape system 220, in accordance with one embodiment. As an option, the present tape system 220 may be implemented in conjunction with features from any other embodiment listed herein, such as those described with reference to the other FIGS. Of course, however, such tape system 220 and others presented herein may be used in various applications and/or in permutations which may or may not be specifically described in the illustrative embodiments listed herein. Further, the tape system 220 presented herein may be used in any desired environment.

As shown, the tape system 220 includes a first transducer array 227, a second transducer array 228, and a tape medium 225. In one embodiment, the first transducer array 227 may comprise a plurality of read elements, and the second transducer array may comprise a plurality of write elements. In another embodiment, the first transducer array 227 may comprise a plurality of write elements, and the second transducer array may comprise a plurality of read elements. In yet another embodiment, the first transducer array 227 and/or the second transducer array 228 may comprise a plurality of write elements and a plurality of read elements. For example, the read elements and write elements may be arranged in an interleaved configuration. Any of the transducer arrays 227/228 may contain one or more servo track readers for reading servo data on the tape medium 225.

In one embodiment, the first transducer array 227 and/or the second transducer array 228 may include a linear transducer array.

The tape medium 225 is shown to include a plurality of servo bands 205, represented by 205a-205e in the figure. The servo bands 205 may be utilized by the transducer arrays 227 and 228 for determining a location of the transducer arrays 227 and 228 relative to the tape medium 225 when reading from and/or writing to the tape medium 225.

As shown in FIG. 2, the tape medium 225 includes a plurality of data bands (e.g., data band 1, data band 2, data band 3 . . . data band N). In various embodiments, the tape medium 225 may include any number, N, of data bands. For example, the tape medium 225 may include two, four, eight, tens, or hundreds of data bands. In a given embodiment of the tape medium 225 that contains 16 data bands, there may located therebetween a total of 17 servo bands 205.

The data bands are defined between servo bands 205. Each data band may include a number of data tracks, for example 1024 data tracks (not shown). During read/write operations, the transducer arrays 227 and 228 are positioned such that read/write elements are positioned to specific track positions within one of the data bands, as will be discussed in more detail below. Outer readers, sometimes called servo readers, read the servo bands 205. Servo signals may in turn be used to keep the transducer arrays 227 and 228 aligned with one or more sets of data tracks during the read/write operations.

A region 230 of the tape system 220 is shown in more detail on the right side of FIG. 2. As shown, data band 1 comprises a plurality of sub-bands 232, represented by 232a-232e in the figure. Each data band may comprise any number of individual sub-bands. As specifically illustrated, data band 1 is shown to comprise sub-band 1 232a, sub-band 2 232b . . . sub-band N 232n. In various embodiments, data band 1 may comprise 4, 8, 16, 32, etc. sub-bands.

Each transducer array 227 and 228 may include read elements or write elements only, and each of the transducer arrays may contain one or more servo readers. For example, the transducer array 227 may include a plurality of write elements 237, and the transducer array 228 may include a plurality of read elements 238, represented by 237a-237e and 238a-238e in the figure, respectively. As another option, the transducer array 227 may include a plurality of read elements 237, and the transducer array 228 may include a plurality of write elements 238. Accordingly, in such embodiments, each of the transducer arrays 227 and 228 may include a coordinate number of read/write elements. For example, if there are 16 sub-bands 232 in the data band 1, then the transducer array 227 may include 16 write elements 237, and the transducer array 228 may include 16 read elements 238. Of course, the number of read/write elements may vary. Illustrative embodiments may include 8, 16, 32, 40, and 64 active read or write elements per transducer array 227/228.

As shown in FIG. 2, the transducer arrays 227 and 228 are oriented to be substantially orthogonal to the direction of the data bands, and the direction of travel of the tape medium 225 during read/write operations. The direction of travel of the tape medium 225 may also be referred to herein as a tape travel direction, tape motion direction, or a direction of tape motion. Further, during a read/write operation of the tape medium 225, each of the elements of a transducer array may be positioned over complementary data tracks of the sub-bands 232. For example, each of the elements 238 of the transducer array 228 may be positioned to write, in parallel, the first data track of each of the sub-bands 232a-232n. Similarly, each of the elements 237 of the transducer array 227 may be positioned to read, in parallel, the first data track of each of sub-bands 232a-232n. Subsequently, each of the elements 237 of the transducer array 227 may be positioned to read, in parallel, the second data track of each of sub-bands 232a-232n.

Generally, the tape medium 225 moves in either a forward or reverse direction, indicated by the arrow showing tape motion in FIG. 2. The tape medium 225 and transducer arrays 227 and 228 operate in a transducing relationship in a manner well-known in the art. In various embodiments each of the elements 227/228 may include multiple modules. For example, each of element 237a and 238a may include a write-read-write (W-R-W) head, in which outer modules for writing flank one or more inner modules for reading. Variations of a multi-module head include a R-W-R head, a R-R-W head, a W-W-R head, etc. In yet other variations, one or more of the modules may have read/write pairs of transducers. Moreover, more than three modules may be present. In further approaches, two outer modules may flank two or more inner modules.

As set forth in more detail below, the geometry of the transducer arrays 227 and 228, and the data tracks written/read by the transducer arrays 227 and 228, may be exploited to improve the reliability and robustness of a symbol timing recovery (STR) scheme utilized by the tape system 220. More specifically, geometric information from N read channels associated with N read elements of a transducer array, or from a subset of the N read channels associated with a subset of the N read elements of the transducer array, may be utilized to improve the reliability of timing-error estimates.

Figure 3A:
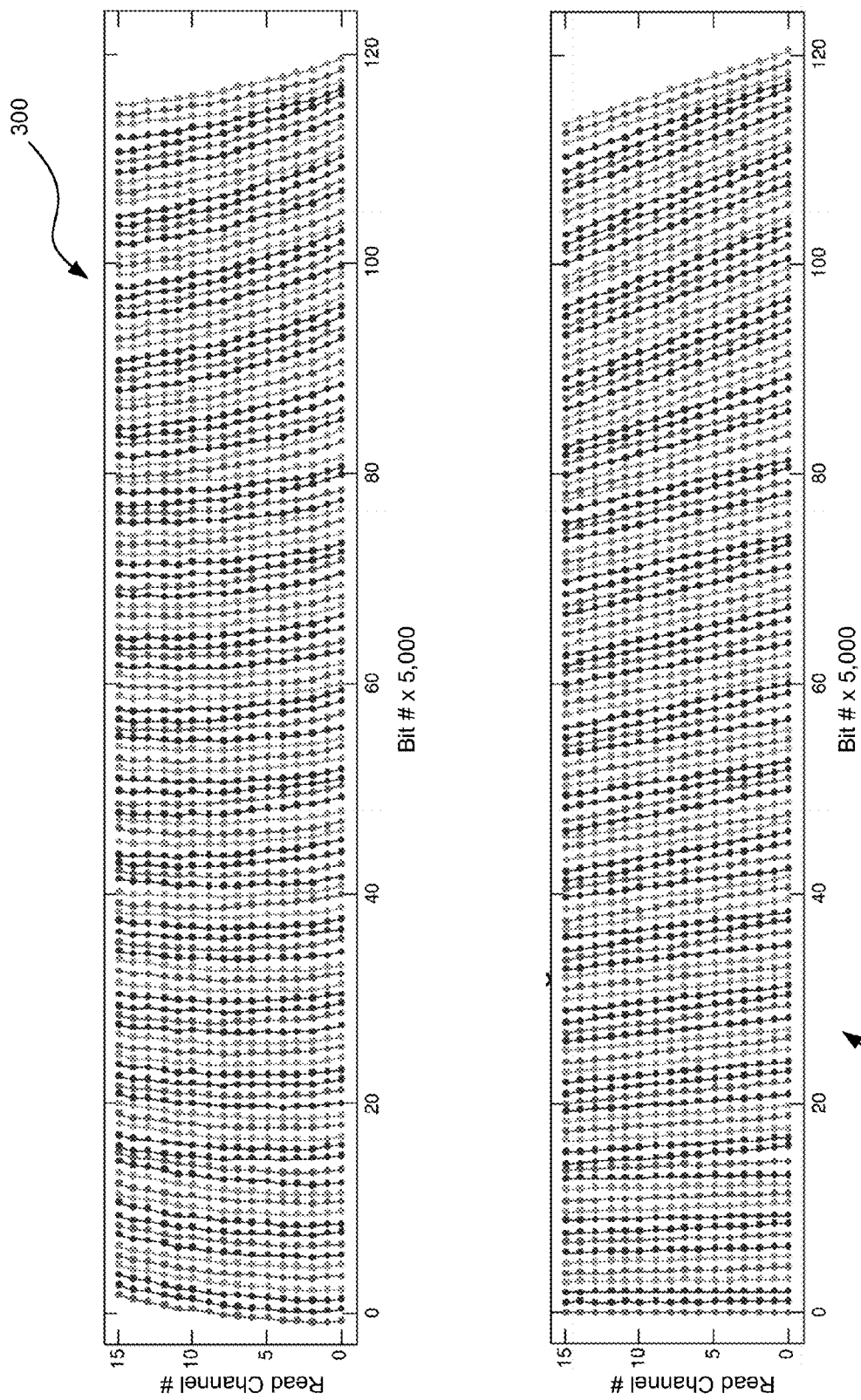
FIG. 3A depicts plots of time/location of every 5,000 bits read from a data band of a tape medium, as seen by a plurality of read channels, according to one embodiment.

FIG. 3A depicts plots of time/location of every 5,000 bits read from a data band of a tape medium, as seen by a plurality of read channels, in accordance with one embodiment. As an option, the present plots may be implemented in conjunction with features from any other embodiment listed herein, such as those described with reference to the other FIGS. Of course, however, such plots, and any others presented herein may be used in various applications and/or in permutations which may or may not be specifically described in the illustrative embodiments listed herein.

Referring to FIG. 3A, a plot 300 depicts the time/location of every 5,000 bits (with 1:5,000 compressed bit distance) read from a data band of tape medium for each of a plurality of read channels of a transducer array. More specifically, the plot 300 depicts the time/location of every 5,000 bits read from 16 sub-bands of a data band of tape media using a transducer array that includes 16 parallel read elements. The plot 300 provides a visualization of where previously-written bits appear in time as those bits are being read back using parallel read channels.

The x-axis of the plot 300 identifies the location of every 5,000th bit on a given read channel in time/location. Each of the 16 read channels is identified using the y-axis, e.g., channels 0-15. Any bits that were written to the tape media at the same time (i.e., in parallel) are connected by a line. For example, the 16 bits written in parallel at time 0 are connected by 15 substantially vertical lines in the plot 300.

As evidence by the bowed conformation of the lines connecting the bits written in parallel, when the parallel-written bits are read back, the bits may not arrive simultaneously at their respective read channels.

Plot 302 of FIG. 3A depicts the data of plot 300 after it has been corrected to align in time the arrival of the first bit (bit 0) read, respectively, by each of the 16 read channels. As shown by the plot 302, there is a strong relationship in the evolution of when the bits arrive, and, more specifically, parallel-written bits for each read time are substantially aligned along a straight line. The straight lines indicate that the arrival time of parallel-written bits may be a function of a skew of a transducer array (that is reading the bits), relative to the data written on the tape medium.

Further, the lines connecting the read time of parallel-written bits evidence various angles of skew of the transducer array relative to the data on the tape medium. As a result, multiple read bits appear on read channel 15 earlier than the last read bit appears on channel 0.

During reading, clock phases may change as a function of the read channel. Thus, each channel may have a phase that is different than the average phase of the plurality of channels, also referred to the average channel phase.

Figure 3B:
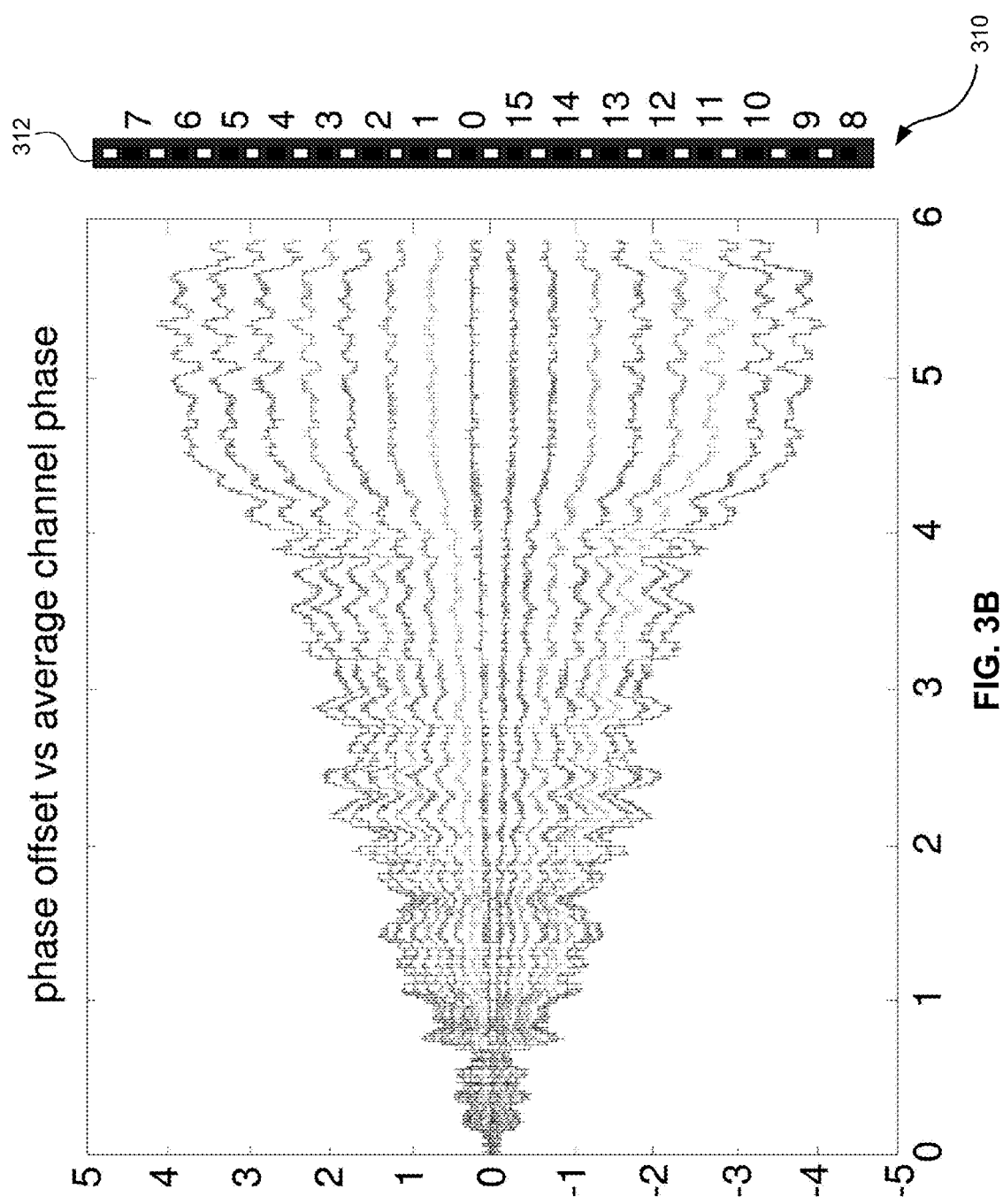
FIG. 3B illustrates the phase offset of a plurality of read channels of a transducer array versus the average channel phase, according to an embodiment.

Referring now to FIG. 3B, a plot 310 depicts the phase offset of a plurality of read channels of a transducer array versus the average channel phase.

As used herein, each read channel includes a separate path through which signals can flow. Further, each reach channel may be associated with a read element positioned on a transducer array, such as the transducer arrays 227 and 228. For example, each read channel may be associated with a corresponding read element, and the read channel may transmit an analog or digital signal representative of bit values of a data track read by the corresponding read element.

The data of the plot 310 is provided in relation to a transducer array 312. In various embodiments, the transducer array 312 may be implemented in the tape system 220 as one of the transducer arrays 227 or 228. Further, as depicted in FIG. 3B, the transducer array 312 is shown to include 16 read elements, numbered from 0-15. Each read element is associated with its own discrete read channel (i.e., read channels 0-15), and the data of the plot 310 is representative of the phase of each read channel 0-15 versus an average channel phase over time.

As shown in FIG. 3B, the read channels are numbered such that read channels 7 and 8 are associated with the outermost read elements 7 and 8, respectively, on the transducer array; and read elements 7 and 8 are equidistance from the center of the transducer array. Similarly, read channels 0 and 1 are associated with the innermost read elements 0 and 1, respectively, on the transducer array; and read elements 0 and 1 are equidistance from the center of the transducer array.

As shown by plot 310, the phase offset of the channels at the outside of the transducer array diverge further from the average channel phase than the phase offset of the channels more central to the transducer array. For example, the phase offset of the outermost read channels 7 and 8 diverge the furthest from the average channel phase. In contrast, the phase offset of the innermost read channels 0 and 1 diverge the least from the average channel phase.

As shown in the plot 310, the phase of channel 7 is larger than the average channel phase. Further, the phase of channel 8 lags behind the average channel phase, and the phase of all the other channels. Because the position of the read element of channel 7 is reflected across the center of the transducer array with respect to the read element of channel 8, read channel 8 may lag behind the average channel phase at a magnitude equal to the amount by which read channel 7 is ahead of the average channel phase.

Referencing FIGS. 3A-3B together, it can be seen that a given bit on channel 7 may arrive about 4 bit periods earlier than the average channel (i.e., channel 0 as shown), while the corresponding bit in channel 8 may lag about 4 bits behind. Thus, between the two channels associated with the outermost read elements of the transducer array, a time of when corresponding bits are observed in the respective channels may correspond to a distance of about 8 bits.

Thus, in view of FIGS. 3A-3B, a highly correlated symbol timing recovery phase and frequency evaluation may be observed on tracks that are read/written in parallel. As a result, an estimated phase difference between a corresponding pair of read channels may be used to compute, using any pair of read elements of a transducer array, a skew of the transducer array relative to the data written on the tape medium.

Further, the computed skew may provide an indication of how the timing on all of the other read channels evolves. Such information may be useful in situations where one read channel suffers from an exaggerated quantity of noise, where the signal is very poor, and it is difficult to measure the phase of the channel. According, using the information determined from neighboring channels, it is possible to estimate what the phase should be of the noisy channel. Such an estimate may be used to avoid cycle slips in systems with low SNR.

Figure 4A:
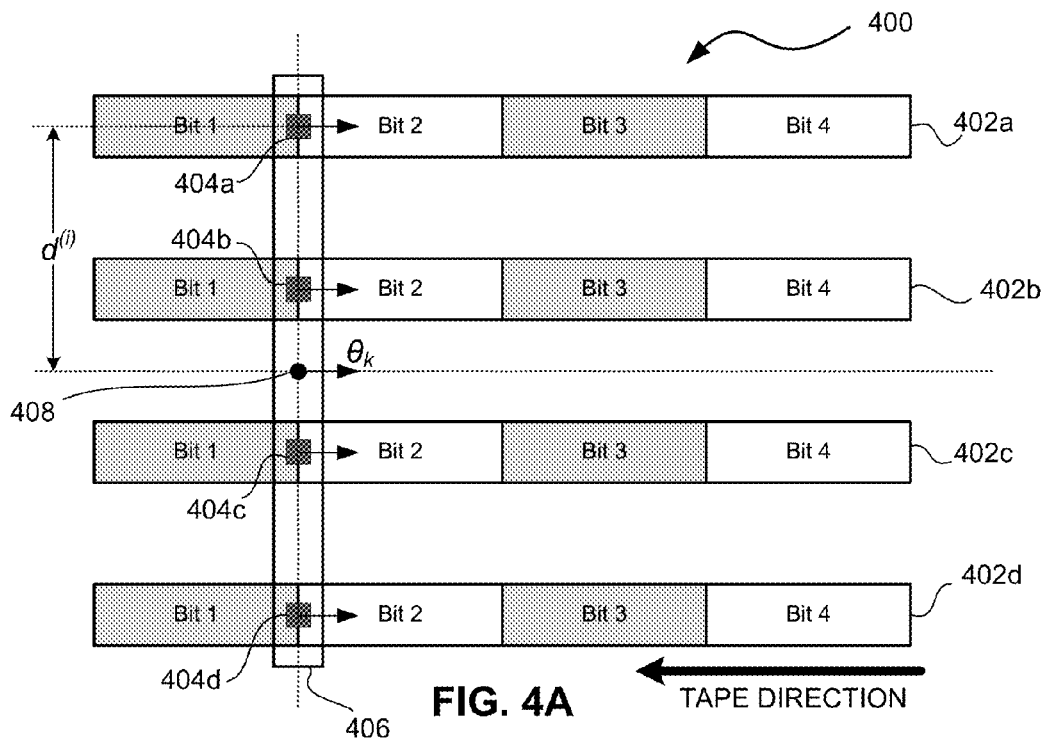
FIGS. 4A-4B illustrate a tape system, according to one embodiment.

FIG. 4A depicts a tape system 400 during an idealized read operation, in accordance with one embodiment. As an option, the present tape system 400 may be implemented in conjunction with features from any other embodiment listed herein, such as those described with reference to the other FIGS. Of course, however, such tape system 400 and others presented herein may be used in various applications and/or in permutations which may or may not be specifically described in the illustrative embodiments listed herein. Further, the tape system 400 presented herein may be used in any desired environment.

The tape system 400 is shown to include a plurality of parallel data tracks 402 on a tape medium, represented by tracks 402a-402d in the figure, and a transducer array 406.

In various embodiments, the transducer array 406 may be substantially identical to the transducer arrays 227/228, described in the context of FIG. 2. The transducer array 406 is shown to include a plurality of read elements 404, represented by read elements 404a-404d in the figure. Further, each of the read elements 404 is shown reading one of the data tracks 402. Each of the data tracks may be a coordinate data track of a different sub-band, as described in the context of FIG. 2. For example, the data track 402a may be in a first sub-band of a data band, the data track 402b may be in a second sub-band of the data band, the data track 402c may be in a third sub-band of the data band, and the data track 402d may be in a fourth sub-band of the data band.

As shown, the four read elements 404a-404d are reading four parallel data tracks 402a-402d, respectively. However, it should be understood that the present invention may be implemented using more than four read elements on a transducer array that are operable to concurrently read more than four parallel data tracks. For example, the present invention may be implemented in a system having 8, 16, 32, etc. read elements on a transducer array that concurrently reads 8, 16, 32, etc. parallel data tracks. Further, in some embodiments, logic may be configured to apply the symbol timing recovery scheme described herein to a subset of total read channels. For example, the four read channels described in the context of FIGS. 4A-4B may be a subset of 8, 16, 32, etc. total read channels that are operating in parallel.

Still yet, each of the data tracks 402 is shown to comprise 4 bits. Between each two adjacent bits of given data track 402 is a bit transition. During read operations of the data tracks 402, it may be desirable to identify the bit transitions between the bits to aid in symbol timing recovery.

In particular, as the transducer array 406 moves right relative to the data tracks 402 (i.e., as the tape medium moves in the tape direction) at a constant velocity, the bit transitions would ideally be observed at regular intervals. However, the transducer array 406 may not always move relative to the data tracks 402 at a constant velocity. For example, there may be some velocity variation, and/or frictional effects due to tape medium contacting various components of a tape drive system. As a result, a phase error may result at the locations where the bit transitions are located.

It is assumed for the tape system 400 that the transducer array 406 has only one degree of freedom, shown in FIG. 4A as $\theta_k$, which is representative of an offset or phase error during sampling. It may be ideal for sampling to occur at each bit transition. If there is a velocity variation in the tape motion, or an error in $\theta_k$, then the data tracks 402 may be sampled at a time/location other than the desired time/location of the bit transitions. However, the structure of the transducer array 406 may be exploited, and the observed error, or sample timing phase error, will the same on all the reader elements. Thus, the first degree of freedom of each read element 404, which may be a translation parallel to the tape direction, is referred to as a phase, $\theta$, or frequency, f.

Figure 4B:
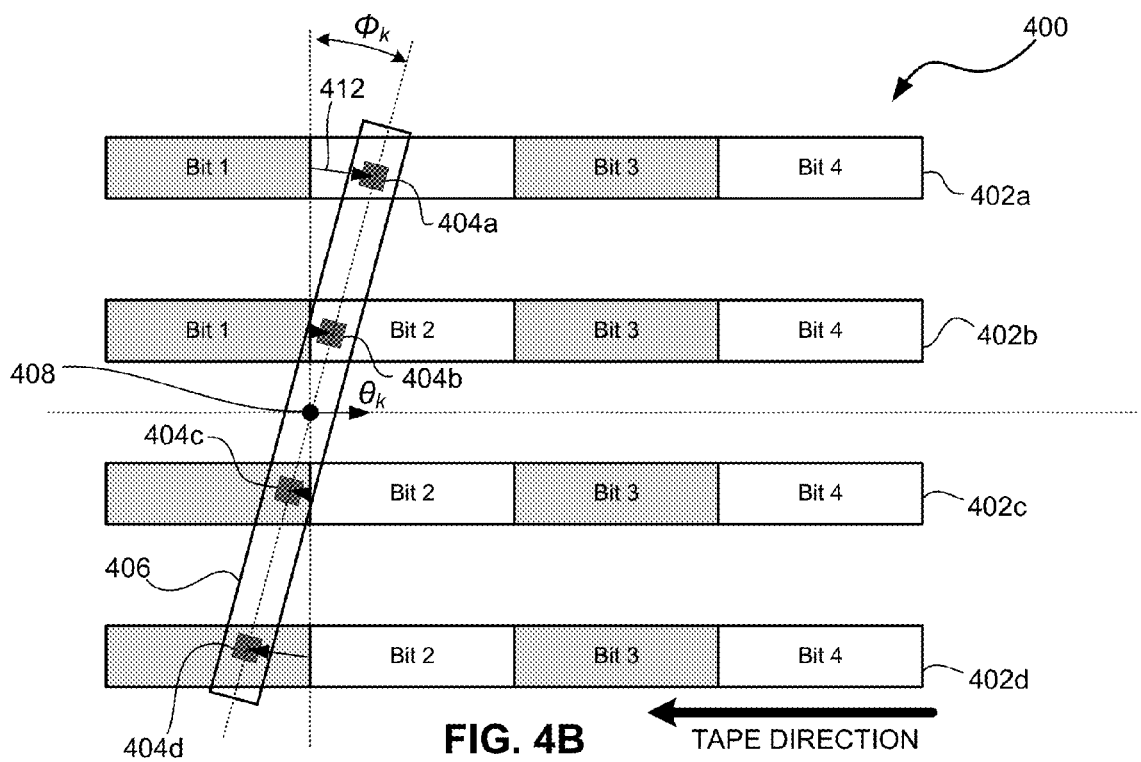

Referring now to FIG. 4B, a second degree of freedom of each read element 404 is illustrated. Under the stress of frictional forces or due to lateral tape motion, etc., the transducer array 406 may skew around its center 408 relative to the tape medium and the written tracks. Thus, each read element 404, as an element fixed in the transducer array 406, may skew in a corresponding direction relative to information written in its associated data track, e.g., as indicated by arrow 412 for a skew of the read element 404a relative to the data track 402a.

While the transducer array 406 is experiencing skew, the tape system 400 may continue to sample the data tracks at timing/location where the bit transitions are expected. However, as shown in FIG. 4B, the read channel associated with the read element 404a will show a large positive phase offset relative to the optimum sampling time, while the read channel associated with the read element 404d will show a large negative phase offset relative to the optimum sampling time. Accordingly, the same error may show up differently on different channels. However, by determining the phase error present on all of the read channels, it is possible to estimate the skew of the transducer array 406, also referred to herein as $\phi_k$, as well as an angular velocity, referred to herein as $\omega_k$.

Thus, as shown by FIG. 4B, when simplified, the dynamics of each read element 404 on the transducer array 406 are determined by two degrees of freedom of the transducer array 406. The first degree of freedom, shown as $\theta_k$ (and $f_k$), is a phase (and frequency), which represents a translation in the tape movement direction. The second degree of freedom, shown as $\phi_k$ (and $\omega_k$), is a skew (and angular velocity), which represents a rotation around the center 408 of the transducer array 406.

Further, the position of each read element 404 is represented by the signed distance $d^{(i)}$ from the center 408 of the transducer array 406. For simplicity, only the $d^{(i)}$ of the read element 404a is shown in FIG. 4A.

The following assumptions may be made to determine that above-noted dynamics of the read elements 404: (1) the transducer array 406 is a rigid member that includes a fixed array of read/write transducer elements; (2) a single reference clock drives all write elements; (3) all read elements (e.g., read heads, etc.) utilize a common analog-to-digital converter (ADC) clock; (4) an initial phase is established during acquisition; and (5) lateral (cross-track) are not considered.

Utilizing the noted two degrees of freedom, everything may be known about the clock phase observed on all of the channels. Thus, by computing the phase and the skew of the transducer array, and utilizing the known geometry of where each read element is located on the transducer array, it is not needed to estimate the phase and the skew on each channel. Further, utilizing a second order model, the derivatives of the phase and the skew may be utilized to obtain, respectively, the frequency and angular velocity of the transducer array. In this manner, how the skew of a transducer array is evolving, and how this skew affects the phase on all of the read channels, may be estimated by observing how the phases evolve on a subset or all of the read channels of the transducer array.

In calculating total phase error, it may be assumed that the skew angles of the transducer array 406 are relatively small. Accordingly, in such embodiments, it may not be necessary to calculate an exact rotation of the read elements 404 relative to an axis that is perpendicular to the data tracks 402 of the tape medium. In such embodiments, the skew may lead to a translation in tape transport direction according to: $d^{(i)} \sin(\phi_k) \approx d^{(i)} \phi_k$ in a linearized or simplified model. In other words, due to the limited distance that the transducer array may rotate, the instant symbol timing recovery scheme may be simplified by linearizing the angle of rotation of the transducer array, instead of taking a sine of the angle of rotation.

The total phase, referred to herein as $\tau_k^{(i)}$, may be calculated as: $\tau_k^{(i)} = \theta_k + d^{(i)} \phi_k$, where k is a time step (discrete time), $\theta_k$ corresponds to a translational error common to all read channels, d is the distance of a read element, i, from a center of the transducer array, and $\phi_k$ is the skew. The distance, d, is dependent on the particular read element, where some read elements are closer to the center of the transducer array, and some of the read elements are further away from the center of the transducer array. Thus, if there are skewing motions, the total phase error observed for a given channel may depend on where the read element for the channel is located on the transducer array.

Still further, in some embodiments, symbol timing recovery may be augmented by adding an additional degree of freedom for each read channel. The additional degree of freedom may include a localized phase offset, θ, of each read element, i. Thus, a localized phase offset of each channel may be referred to herein as $\theta_k^{(i)}$.

The localized phase offset of each channel may include a translation in the tape direction, and may be due to external factors such as frictional gradients on the surface of the tape medium, or different coefficients of friction between the read elements 404 on the transducer array 406. In other words, not all of the observed phase error may be completely described by the two degrees of freedom of the transducer array.

In such embodiments, a total phase may be calculated as: $\tau_k^{(i)} = \theta_k + d^{(i)} \phi_k + \theta_k^{(i)}$. In other words, the above-described symbol timing recovery scheme employing two degrees of freedom may be augmented by including, for each read channel, an additional local phase offset for the channel when calculating the total phase error. Such augmentation of the symbol timing recovery scheme may be useful in tape systems that experience a high signal to noise ratio to correct for small scale local phase offsets which may otherwise lead to performance degradations.

Accordingly, in the context of the four channel tape system 400 of FIG. 4B, a total phase for a first channel (channel 0) associated with the read element 404a may be calculated as $\tau_k^{(0)} = \theta_k + d^{(0)} \phi_k + \theta_k^{(0)}$; a total phase for a second channel (channel 1) associated with the read element 404b may be calculated as $\tau_k^{(1)} = \theta_k + d^{(1)} \phi_k + \theta_k^{(1)}$; a total phase for a third channel (channel 2) associated with the read element 404c may be calculated as $\tau_k^{(2)} = \theta_k + d^{(2)} \phi_k + \theta_k^{(2)}$; and a total phase for a fourth channel (channel 3) associated with the read element 404d may be calculated as $\tau_k^{(3)} = \theta_k + d^{(3)} \phi_k + \theta_k^{(3)}$.

Figure 5A:
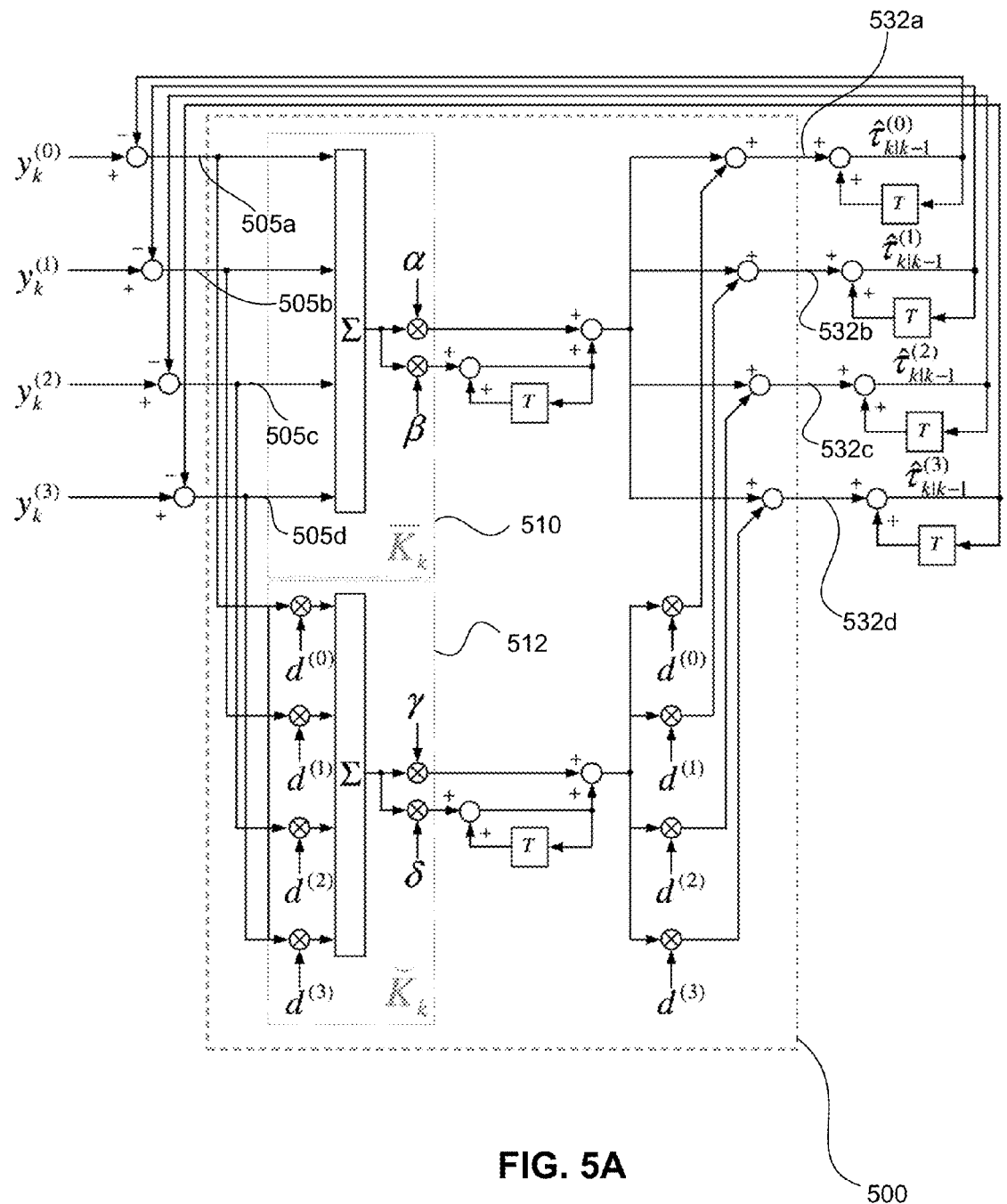
FIG. 5A illustrates a filter loop, according to one embodiment.

FIG. 5A illustrates a loop filter 500 for use in symbol timing recovery, in accordance with one embodiment. As an option, the present loop filter 500 may be implemented in conjunction with features from any other embodiment listed herein, such as those described with reference to the other FIGS. Of course, however, such loop filter 500 and others presented herein may be used in various applications and/or in permutations which may or may not be specifically described in the illustrative embodiments listed herein. Further, the loop filter 500 presented herein may be used in any desired environment.

As shown in FIG. 5A, the loop filter 500 includes a translational portion 510 and a skew portion 512. The loop filter 500 is illustrated as receiving four input signals 505, which represent four timing error detector output signals, represented by signals 505a-505d in the figure. In the system model of FIG. 5A, the loop filter input signals 505, which represent phase-error estimates $e_k^{(i)} = y_k^{(i)} - \hat{\tau}_{k|k-1}^{(i)}$, correspond to the difference between the noisy observation $y_k^{(i)}$ of the sampling phase of the readback signal from the read elements and the estimated sampling phase $\hat{\tau}_{k|k-1}^{(i)}$ from the STR loop. The loop filter outputs 532 are fed to integrators. The integrator output $\hat{\tau}_{k|k-1}^{(i)}$ represents the integrated/accumulated output of the loop filter output.

In various embodiments, each of the timing error detector output signals ($e_k^{(i)}$) 505 may include a phase-error estimate for a corresponding read channel. In another embodiment, each of the timing error detector output signals may include a timing-error estimate for a corresponding read channel.

The four timing error detector output signals may be received from one or more timing error detectors. For example, each of the timing error detector output signals may be received from a different timing error detector, and correspond to a signal received on a read channel from one of the read elements 404 described in the context of FIGS. 4A-4B. More specifically, the timing error detector output signals $e_k^{(0)}$, $e_k^{(1)}$, $e_k^{(2)}$, and $e_k^{(3)}$ may correspond to signals received via read channels from the read elements 404a, 404b, 404c, and 404d, respectively, and indicate a determined timing correction for each respective read channel. In one embodiment, each of the timing error detector output signals may be received from a different timing error detector.

While four timing error detector output signals are shown and described for simplicity, it is understood that, in various embodiments, more or less than four timing error detector output signals may be received. In a tape system utilizing a plurality N of read channels, N timing error detector output signals may be provided from one or more timing error detectors to the loop filter 500. For example, 8, 16, 32, etc. timing error detector output signals corresponding to 8, 16, 32, etc. read channels may be received. Still further, the N timing error detector output signals may be divided into M subsets, and provided to (N/M) loop filters 500. For example, in a tape system having 16 read channels, read signals from the 16 read channels may be divided for processing into 4 subsets, and each of four loop filters 500 may each receive one of the four subsets of timing error detector output signals. In such embodiments, it may be desirable to group the read channels such that each subset includes read channels received from adequately distanced read elements, to ensure that skewing can be adequately observed, and to obtain larger phase offsets.

In addition to the four input signals 505, α, β, γ, and δ variables are also shown provided as input parameters to the loop filter 500. In one embodiment, the α variable represents a phase lock loop (PLL) proportional gain value, the γ variable also represents a PLL proportional gain value, the β variable represents a PLL integral gain value, and the δ variable also represents PLL integral gain value. Adjustments may be made to the values of the α and β variables to configure the weight given to a calculated phase and frequency estimate, respectively. Similarly, adjustments may be made to the values of the γ and δ variables to configure the weight given to a calculated skew and angular velocity estimate, respectively.

Within the translation portion 510 of the loop filter 500, each of the input signals 505 is summed, and this sum is then filtered using the proportional gain value, α, to obtain an α-filtered phase estimate; and filtered using the integral gain value, β, to obtain a β-filtered phase estimate.

The α-filtered phase estimate and the β-filtered phase estimate are then combined to determine a phase estimate, $\theta_k$, of the transducer array. Thus, phase estimates or timing-error estimates of a plurality of read channels of a transducer array may be summed and filtered to calculate an estimate of the phase, $\theta_k$, of the transducer array. The phase estimate, $\theta_k$, may represent a common phase offset between a write (transmit) clock and a read (receive) clock. Because it may be assumed that any phase error due to translational artifacts affecting the transducer array would affect all read channels similarly, the phase estimate, $\theta_k$, may be subsequently utilized for signal timing recovery of all the channels of the transducer array.

Still yet, the skew portion 512 of the loop filter 500 receives the four input signals 505. Each of the four input signals 505 is then weighted by a distance value, d, associated with the corresponding read channel, to obtain a plurality of weighted phase estimates. As noted above, each distance value depends on a location of a read element of the read channel relative to a common designated point. As described above, the distance value of each channel may be based on a distance of the corresponding read element of the read channel from a center of the transducer array. Further, each of the weighted phase estimates for the plurality of read channels is summed, and an estimate of transducer array skew, $\phi_k$, is then calculated using the sum of the weighted inputs, the PLL proportional gain value, $\gamma$, and the PLL integral gain value, $\delta$. In particular, the summation of the weighted phase estimate is filtered using the proportional gain value, $\gamma$, to obtain an $\gamma$-filtered skew estimate; and filtered using the integral gain value, $\delta$, to obtain a $\delta$-filtered skew estimate.

The $\gamma$-filtered skew estimate and the $\delta$-filtered skew estimate are then combined to determine the skew estimate, $\phi_k$, of the transducer array.

Subsequently, the transducer array skew estimate, $\phi_k$, is then multiplied by each distance value, $d^{(i)}$, associated with each of the N read channels. As shown, in FIG. 5A, N=4, and the skew estimate, $\phi_k$, is multiplied by each of $d^{(0)}$, $d^{(1)}$, $d^{(2)}$, and $d^{(3)}$ to produce an output for each of the channels 0-3. Finally, each calculated $\phi_k d^{(i)}$ value is then summed with the phase estimate, $\theta_k$, the calculation of which is described above, to obtain N total phase estimates 532a-532d, $\tau_k^{(i)}$. In view of the above, each of the total phase estimates 532a-532d may be calculated utilizing a weighted combining of the calculated phase and skew estimates.

Each of the total phase estimates 532a-532d, $\tau_k^{(i)}$, may be utilized in updating the symbol timing. In various embodiments, the total phase estimates 532a-532d may be applied to optimally sample or re-sample the received signals in the read channels. For example, a control unit may utilize one of the total phase estimates 532a-532d for controlling the re-sampling of a read channel signal using an interpolation filter.

Figure 5B:
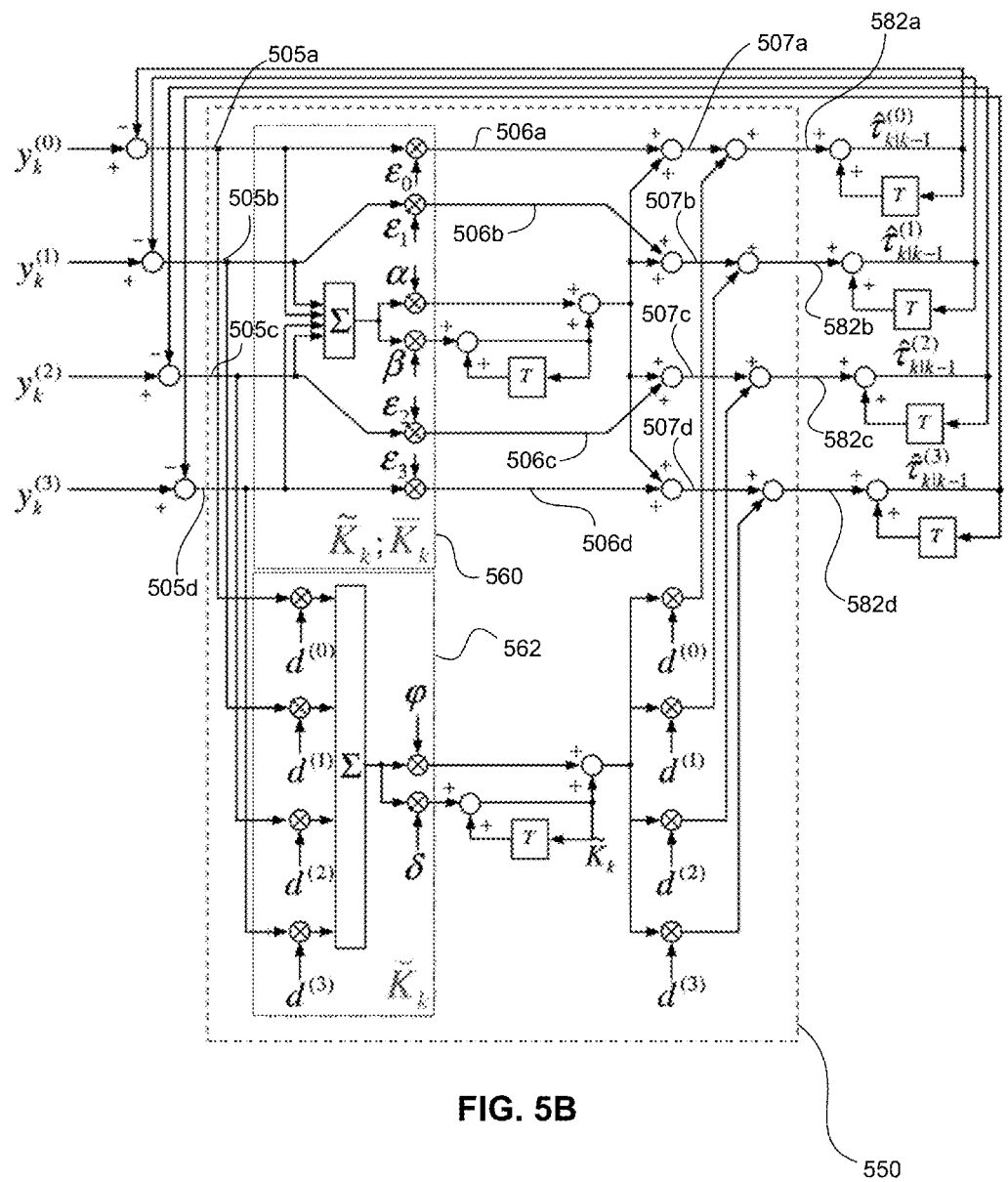
FIG. 5B illustrates a filter loop, according to another embodiment.

FIG. 5B depicts a loop filter 550 for use in symbol timing recovery, in accordance with one embodiment. As an option, the present loop filter 550 may be implemented in conjunction with features from any other embodiment listed herein, such as those described with reference to the other FIGS. Of course, however, such loop filter 550 and others presented herein may be used in various applications and/or in permutations which may or may not be specifically described in the illustrative embodiments listed herein. Further, the loop filter 550 presented herein may be used in any desired environment.

As described below, the loop filter 550 may provide a STR scheme that accounts for artifacts affecting a limited number of read channels of a transducer array. In other words, the loop filter 550 may provide a STR scheme that accounts for signal noise that results due to one or more factors other than transducer array translation or skew.

As shown in FIG. 5B, the loop filter 550 is shown to include a translational portion 560 and a skew portion 562. The loop filter 550 is illustrated as receiving four input signals 505, which represent four timing error detector output signals, represented by signals 505a-505d in the figure. In the system model of FIG. 5B, the loop filter input signals 505, which represent phase-error estimates $e_k^{(i)} = y_k^{(i)} - \hat{\tau}_{k|k-1}^{(i)}$, correspond to the difference between the noisy observation $y_k^{(i)}$ of the sampling phase of the readback signal from the read elements and the estimated sampling phase $\hat{\tau}_{k|k-1}^{(i)}$ from the STR loop. The loop filter outputs 582 are fed to integrators. The integrator output $\hat{\tau}_{k|k-1}^{(i)}$ represents the integrated/accumulated output of the loop filter output.

In various embodiments, each of the timing error detector output signals ($e_k^{(i)}$) 505 may include a phase-error estimate for a corresponding read channel. In another embodiment, each of the timing error detector output signals may include a timing-error estimate for a corresponding read channel.

The four timing error detector output signals may be received from one or more timing error detectors. For example, each of the timing error detector output signals may be received from a different timing error detector, and correspond to a signal received on a read channel from one of the read elements 404 described in the context of FIGS. 4A-4B. More specifically, the timing error detector output signals $e_k^{(0)}$, $e_k^{(1)}$, $e_k^{(2)}$, and $e_k^{(3)}$ may correspond to signals received via read channels from the read elements 404a, 404b, 404c, and 404d, respectively, and indicate a determined timing correction for each respective read channel. In one embodiment, each of the timing error detector output signals may be received from a different timing error detector.

While four timing error detector output signals are shown and described for simplicity, it is understood that, in various embodiments, more or less than four timing error detector output signals may be received. In a tape system utilizing a plurality N of read channels, N timing error detector output signals may be provided from one or more timing error detectors to the loop filter 550. For example, 8, 16, 32, etc. timing error detector output signals corresponding to 8, 16, 32, etc. read channels may be received. Still further, the N timing error detector output signals may be divided into M subsets, and provided to (N/M) loop filters 550. For example, in a tape system having 16 read channels, read signals from the 16 read channels may be divided for processing into 4 subsets, and each of four loop filters 550 may each receive one of the four subsets of timing error detector output signals. In such embodiments, it may be desirable to group the read channels such that each subset includes read channels received from adequately distanced read elements, to ensure that skewing can be adequately observed, and to obtain larger phase offsets.

In addition to the four input signals 505, $\alpha$, $\beta$, $\phi$, $\delta$, and four $\epsilon$ ($\epsilon_0$, $\epsilon_1$, $\epsilon_1$, and $\epsilon_3$) variables are also shown provided as input parameters to the loop filter 550. In one embodiment, the $\alpha$ variable represents a phase lock loop (PLL) proportional gain value, the $\phi$ variable also represents a PLL proportional gain value, the $\beta$ variable represents a PLL integral gain value, and the $\delta$ variable also represents PLL integral gain value. Adjustments may be made to the values of the $\alpha$ and $\beta$ variables to configure the weight given to a calculated phase and frequency estimate, respectively. Similarly, adjustments may be made to the values of the $\phi$ and $\delta$ variables to configure the weight given to a calculated skew and angular velocity estimate, respectively.

Within the translation portion 560 of the loop filter 550, each of the input signals 505 is summed, and this sum is then filtered using the proportional gain value, $\alpha$, to obtain an $\alpha$-filtered phase estimate; and filtered using the integral gain value, $\beta$, to obtain a $\beta$-filtered phase estimate.

The $\alpha$-filtered phase estimate and the $\beta$-filtered phase estimate are then combined to determine a phase estimate, $\theta_k$, of the transducer array. Thus, phase estimates or timing-error estimates of a plurality of read channels of a transducer array may be summed and filtered to calculate an estimate of the phase, $\theta_k$, of the transducer array. The phase estimate, $\theta_k$, may represent a common frequency offset, or phase, between a write (transmit) clock and a read (receive) clock. Because it may be assumed that any phase error due to translational artifacts affecting the transducer array would affect all read channels similarly, the phase estimate, $\theta_k$, may be subsequently utilized for signal timing recovery of all the channels of the transducer array.

Still yet, within the translation portion 560 of the loop filter 550, each of the four c variables weight a corresponding channel's input signal 505 to obtain a proportional gain 506 (506a-506d) for each channel. As shown in FIG. 5B, each input signal 505 is weighted by a corresponding c variable to generate a corresponding proportional gain 506 for the channel. In this manner, received individual channel timing-error estimates may be weighted to generate the proportional gains 506. Further, each proportional gain 506 is separately added to the calculated estimate of the phase of the transducer array, $\theta_k$, to calculate a channel-adjusted phase estimate 507 for each channel (i.e., channel-adjusted phase estimates 507a, 507b, 507c, and 507d). In this manner, the calculated phase estimate of the transducer array, $\theta_k$, may be adjusted to accommodate translational artifacts affecting some read elements of a transducer array, but not others, such as, for example, an elevated amount of friction present at a single read element.

In various embodiments, each $\epsilon$ variable may be adjusted to control or limit the impact of an individual channel timing-error estimate on a timing adjustment. As shown in FIG. 5B, each of the four $\epsilon$ variables ($\epsilon_0$, $\epsilon_1$, $\epsilon_2$, and $\epsilon_3$) correspond to a respective one of the N timing error detector output signals 505. For example, it is understood that $\epsilon_0$ corresponds to the timing error detector output signal 505a, also denoted as $e_k^{(0)} = y_k^{(0)} - \hat{\tau}_{k|k-1}^{(0)}$ in FIG. 5B; $\epsilon_1$ corresponds to the timing error detector output signal 505b, also denoted as $e_k^{(1)} = y_k^{(1)} - \hat{\tau}_{k|k-1}^{(1)}$ in FIG. 5B; $\epsilon_2$ corresponds to the timing error detector output signal 505c, also denoted as $e_k^{(2)} = y_k^{(2)} - \hat{\tau}_{k|k-1}^{(2)}$ in FIG. 5B; and $\epsilon_3$ corresponds to the timing error detector output signal 505d, also denoted as $e_k^{(3)} = y_k^{(3)} - \hat{\tau}_{k|k-1}^{(3)}$ in FIG. 5B. Accordingly, in embodiments in which a loop filter 550 is designed to operate on 8, 16, etc. input signals, it is understood that 8, 16, etc., respective, variables may be configured.

In one embodiment, the loop filter 550 may be implemented in a manner that renders its operation similar to the loop filter 500, discussed in the context of FIG. 5A. In particular, each of the c variables may be set to a value of 0, such that the proportional gain 506 for each channel is determined to be 0. As a result, because effectively no proportional gain 506 is applied to the individual read channels when each of the timing-error estimates are weighted by 0, each channel-adjusted phase estimate 507 is substantially identical (i.e., 0) across the read channels.

In another embodiment, a filter loop may be implemented such that the proportional gain for a given channel is determined based on one or more neighboring channels. In such an embodiment, for example, the timing-error estimate utilized to calculate the proportional gain for a channel may include a weighted combination of a timing-error estimate for the channel, and one or more of its neighboring channels.

In one embodiment, the individual channel timing-error estimates, or phase estimates, may be constrained to a maximum range. In another embodiment, integrals of the individual channel timing-error estimates, or phase estimates, may be constrained to a maximum range. Such constraints may be implemented for preventing cycle slips on individual channels. In one embodiment, the phase offset introduced by the individual channel timing-error estimates, or phase estimates, may be constrained to less than or equal to one half of a symbol length. In another embodiment, the phase offset introduced by the individual channel timing-error estimates, or phase estimates, may be constrained to less than or equal to 20% of a symbol length. In yet another embodiment, the phase offset introduced by the individual channel timing-error estimates, or phase estimates, may be constrained to less than or equal to 10% of a symbol length. In such embodiments, the symbol length may be equal to the length of a bit written to a magnetic medium, such as a tape medium. Further, such constraints may be implemented using the variables.

Still yet, the skew portion 562 of the loop filter 550 receives the four input signals 505. Each of the four input signals 505 is then weighted by a distance value, d, associated with the corresponding read channel, to obtain a plurality of weighted phase estimates. As noted above, each distance value depends on a location of a read element of the read channel relative to a common designated point. As described above, the distance value of each channel may be based on a distance of the corresponding read element of the read channel from a center of the transducer array. Further, each of the weighted phase estimates for the plurality of read channels is summed, and an estimate of transducer array skew, $\phi_k$, is then calculated using the sum of the weighted inputs, the PLL proportional gain value, $\phi$, and the PLL integral gain value, $\delta$. In particular, the summation of the weighted phase estimate is filtered using the proportional gain value, $\phi$, to obtain a $\phi$-filtered skew estimate; and filtered using the integral gain value, $\delta$, to obtain a $\delta$-filtered skew estimate.

The $\phi$-filtered skew estimate and the $\delta$-filtered skew estimate are then combined to determine a skew estimate, $\phi_k$, of the transducer array. Subsequently, the transducer array skew estimate, $\phi_k$, is then multiplied by each distance value, $d^{(i)}$, associated with each of the N read channels. As shown, in FIG. 5B, N=4, and the skew estimate, $\phi_k$, is multiplied by each of $d^{(0)}$, $d^{(1)}$, $d^{(2)}$, and $d^{(3)}$ to produce an output for each of the channels 0-3.

Finally, each calculated $\phi_k d^{(i)}$ value is then summed with its corresponding channel-adjusted phase estimate 507, the calculation of which is described above, to obtain N total phase estimates 582a-582d, $\tau_k^{(i)}$. For example, as shown in FIG. 5B, the channel-adjusted phase estimate 507a for channel 0 is summed with the calculated $\phi_k d^{(0)}$ value, the channel-adjusted phase estimate 507b for channel 1 is summed with the calculated $\phi_k d^{(1)}$ value, the channel-adjusted phase estimate 507c for channel 2 is summed with the calculated $\phi_k d^{(2)}$ value, and the channel-adjusted phase estimate 507d for channel 3 is summed with the calculated $\phi_k d^{(3)}$ value. In view of the above, each of the total phase estimates 582a-582d may be calculated utilizing a weighted combining of the calculated phase and skew estimates.

Each of the total phase estimates 582a-582d, $\tau_k^{(i)}$, may be utilized in updating the symbol timing. In various embodiments, the total phase estimates 582a-582d may be applied to optimally sample or re-sample the received signals in the read channels. For example, a control unit may utilize one of the total phase estimates 582a-582d for controlling the re-sampling of a read channel signal using an interpolation filter.

By implementing one of the loop filters 500 or 550 in a symbol timing recovery scheme, cycle slips may be significantly reduced in systems affected by both low and high signal-to-noise ratios.

Figure 6:
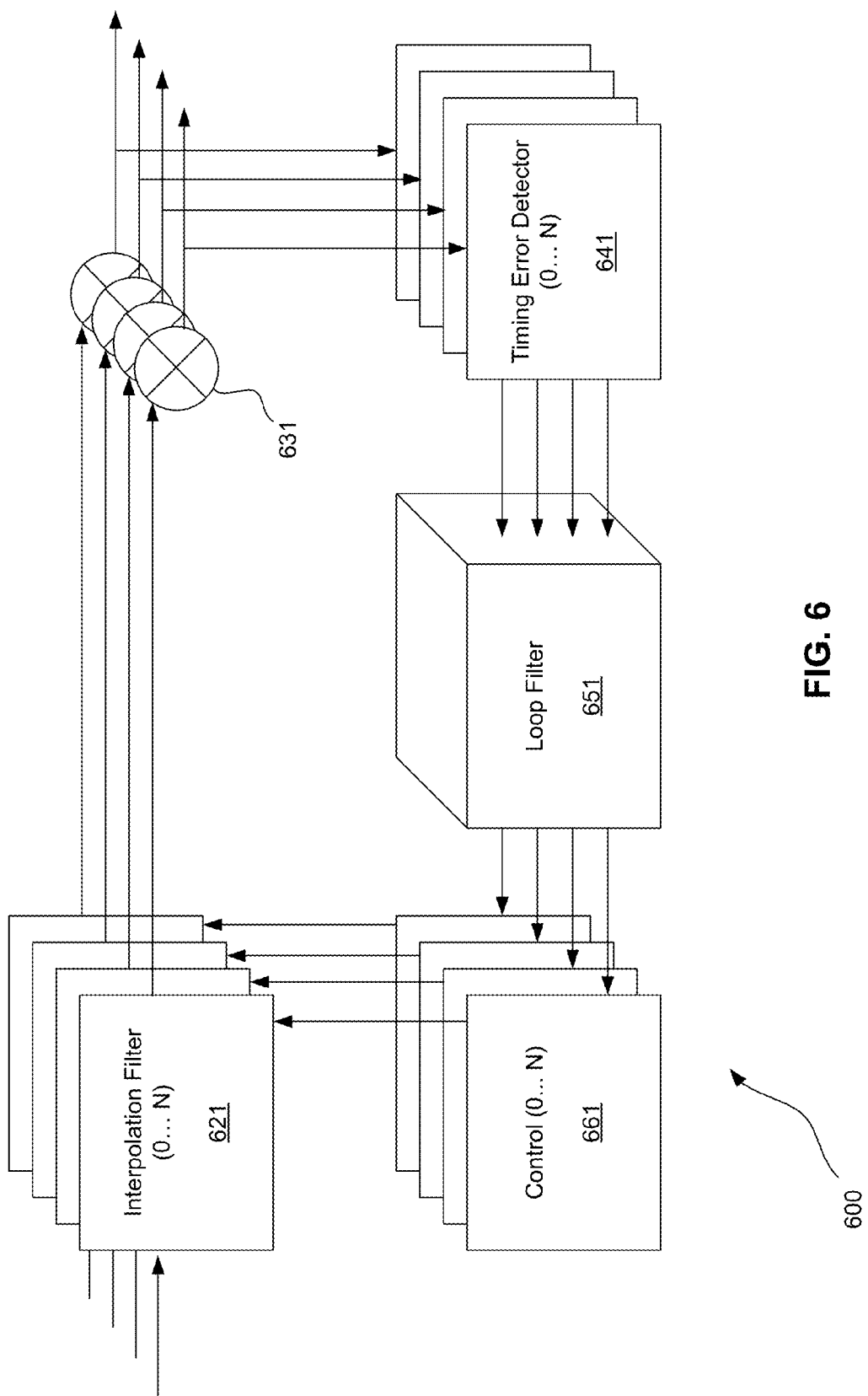
FIG. 6 illustrates a multi-channel recording system, according to one embodiment.

FIG. 6 depicts a multi-channel recording system 600, in accordance with one embodiment. As an option, the present multi-channel recording system 600 may be implemented in conjunction with features from any other embodiment listed herein, such as those described with reference to the other FIGS. Of course, however, such multi-channel recording system 600 and others presented herein may be used in various applications and/or in permutations which may or may not be specifically described in the illustrative embodiments listed herein. Further, the multi-channel recording system 600 presented herein may be used in any desired environment.

As shown in FIG. 6, the multi-channel recording system 600 includes a plurality of interpolation filters 621, a plurality of amplifiers 631, a plurality timing error detectors 641, a loop filter 651, and a plurality of control units 661.

In various embodiments, there may be N of each of the interpolation filters 621, the amplifiers 631, the timing error detectors 641, and the control units 661. In such embodiments, N may be the number of read/write channels of a transducer array used to read/write a tape medium. Still yet, in other embodiments, N may be a number of read/write channels or read/write elements of a subset of read/write elements of a transducer array used to read/write a tape medium. Each of the interpolation filters 621 may be in communication with a different one of the N read/write channels.

Although not shown, the multi-channel recording system 600 may further include hardware for performing analog-to-digital conversion, equalization, detection, decoding, etc. for each of the N channels. For example, although not shown, each of N read elements may be connected to an analog front-end, and the analog front-end is in communication with an analog-to-digital converter that receives a readback signal of binary information written on a tape medium. Further, an equalizer may receive a signal from the analog-to-digital converter, filter the signal by removing inter-symbol interference in the signal, and then provide the filtered signal to a corresponding interpolation filter 621. Each interpolation filter 621 may receive an incoming waveform, and attempt to sample it at an optimum time. In one embodiment, the interpolation filter 621 may sample the incoming waveform at the bit clock, and the output of the interpolation filter 621 may include the bit clock, which is amplified and provided to the timing error detector 641. In one embodiment, the equalizer may be located after the interpolation filter 621, i.e. within the symbol timing recovery loop.

Each of the timing error detectors 641 may output a timing error detector output signal. Each timing error detector output signal may include a noise estimate for a read/write channel. The noise estimate may be based on various sources of noise associated with the read/write channel, such as velocity variations, noise in the write process, transition noise, pre-amp noise, Voltage Controlled Oscillator (VCO) noise, and quantization noise due to analog-to-digital conversion. Each of the timing error detectors 641 may output a phase or frequency offset for use in resampling the signal received by the interpolation filters 621. Further, the loop filter 651 may filter the output of the timing error detectors 641, and adjustments to the sampling time of the interpolation filters 621 may be controlled by a respective control unit 661 based on output of the loop filter 651. The output of the loop filter 651 may include a plurality of total phase estimates, one for each of the N channels, the calculation of which is described above. Thus, the multi-channel recording system 600 may provide a loop for converging on the correct sampling point and bit clock for reading data from a tape medium.

The loop filter 651 may comprise one of the loop filters 500 or 550 described within the context of FIGS. 5A-5B. Accordingly, the loop filter 651 may be operable to receive N timing-error estimates from N timing error detectors 641 associated with N read/write channels of N read/write elements of a transducer array. Further, the loop filter 651 may then compute a common frequency offset or phase between a write (transmit) clock and a read (receive) clock. Additionally, the loop filter 651 may compute a common skew between an array of writers (transmitters) and an array of readers (receivers); or may compute a common skew between an array of readers (receivers) and the way data has been previously written to the tape medium. In some embodiments, the loop filter 651 receives an individual timing error phase for each of the N channels.

In one embodiment, using the common phase and the common skew, the loop filter 651 may compute a total phase estimate for each of the N channels. In another embodiment, using the common phase, the common skew, and individual timing-error estimates for each of the N channels, the loop filter 651 may compute a total phase estimate for each of the N channels. Each total phase estimate may be output from the loop filter 651 as a total phase signal or total phase estimate signal.

The total phase estimate for each channel may be computed by a weighted combining of the common phase and the common skew; or by a weighted combining of the common phase, the common skew, and the individual timing-error estimates for each of the N channels, as discussed in the context of FIGS. 5A-5B. Each total phase estimate may then be applied to each of the N channels for optimally re-sampling the received signals in the read channels.

Thus, the interpolation filters 621 may be provided input from the control units 661 based on the calculated common phase and skew, and this input based on the calculated common phase and skew may be utilized by the interpolation filters 621 to best sample (and re-sample) an incoming bit stream at the best sampling time. By using information from all N channels, or from a group of or subset of the N channels, the multi-channel recording system 600 may implement a reliable and robust STR scheme.

Accordingly, the present disclosure introduces a geometrically inspired system model for STR in parallel recording channels, and derives STR schemes and implementations for improving system performance and robustness by exploiting information from parallel tracks. Such STR schemes and implementations may be implemented in systems employing a static array of write/read transducers that are driven by a common write-clock when writing data tracks, and where read channel analog-to-digital converters are synchronously sampling a readback signal using a common read clock.

The STR schemes and implementations described herein may significantly reduce, or eliminate, cycle slip events occurring on individual channels. Cycle slips lead to loss-of-lock events and long bursts of errors, which may severely degrade system performance. Further, the STR schemes and implementations described herein may allow low SNR operating points because of a robustness to cycle slips. Such low SNR operating points may be necessary to enable future generations of tape systems, which may employ increasingly higher track densities and decreasing reader widths.

Figure 7:
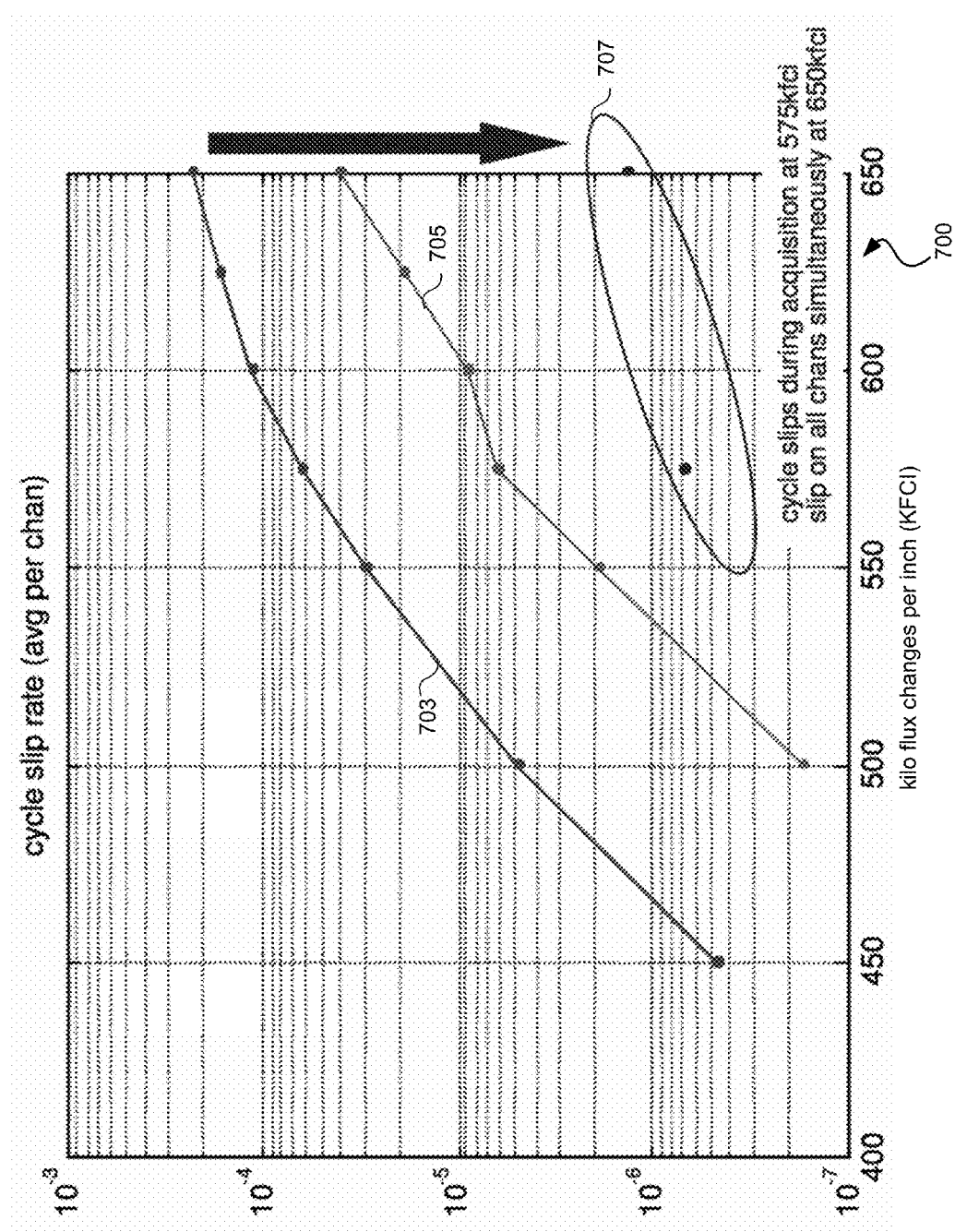
FIG. 7 illustrates a comparison of cycle slip rates per channel of different STR schemes, according to an embodiment.

FIG. 7 depicts a plot 700 of experimental results comparing cycle slip rates per channel of different STR schemes, in accordance with one embodiment.

The plot 700 illustrates experimental results comparing different cycle slip rates (per channel) of different STR schemes employed during the read of a tape medium using a reader with a 0.3 micrometer width. The y-axis of the plot 700 indicates the cycle slip rate, and the x-axis of the plot 700 indicates a linear recording density (bit transitions per inch), measured in kilo flux changes per inch (KFCI). Further, the results of three STR schemes are shown for comparison. First, results 703 are shown for a conventional STR scheme. Second, results 705 are shown for a Global Timing Control (GTC) STR scheme, which uses a statistical model of correlation, as described in Ölçer, S., Jens Jelitto, and Robert A. Hutchins, "Global timing control with applications to tape storage channels," *Global Telecommunications Conference,* 2008, *IEEE GLOBECOM* 2008. Third, results 707 are shown for a STR scheme of the present disclosure, which is based on a geometrical model.

As shown by the plot 700, the results 703 show a substantial increase in the cycle slip rate of the conventional STR scheme in response to an in increase in linear density. The results 705 show that the GTC STR scheme provides an improvement over the conventional STR scheme by reducing the cycle slip rate across all linear densities. However, the GTC STR scheme still suffers from a considerable number of cycle slips.

In contrast, the results 707 shown for the STR scheme of the present disclosure indicate that cycle slips are reduced by at least an order of magnitude across all linear densities.

The cycles slips occurring across all STR schemes at 650 KFCI may be unavoidable unless it is known exactly what bits are being transmitted.

Thus, the geometrically modeled STR schemes and implementations of the present disclosure may provide benefits over purely statistically modeled STR schemes, by reducing the cycle slip rate during read/write operations of tape media.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An apparatus, comprising:
    a loop filter receiving a plurality of input signals, wherein each of the input signals is based on a different timing error detector output signal;
    a plurality of read channels;
    a plurality of interpolation filters, each of the interpolation filters in communication with a corresponding one of the read channels; and
    an array of transducers, wherein each of the transducers is in communication with a corresponding one of the read channels;
    wherein the loop filter processes the plurality of input signals, and outputs a different total phase signal for each received input signal;
    wherein each of the interpolation filters samples the corresponding read channel based on one of the total phase signals output by the loop filter;
    wherein the loop filter processes the plurality of input signals by calculating a phase estimate of the samples, and a skew estimate of the samples, relative to written data.

2. The apparatus as recited in claim 1, further comprising a plurality of control units.

3. The apparatus of claim 2, wherein each of the control units receives one of the total phase signals from the loop filter.

4. The apparatus of claim 3, wherein each of the control units controls, utilizing the total phase signal received from the loop filter, the sampling by a corresponding one of the interpolation filters.

5. The apparatus of claim 4, wherein each of the total phase signals is based on the calculated phase estimate and the calculated skew estimate.

6. The apparatus of claim 5, wherein each of the total phase signals is further based on a different channel timing-error estimate, wherein each of the channel timing-error estimates is associated with a corresponding one of the read channels.

7. The apparatus of claim 1, wherein the array of transducers includes a linear array of transducers.

8. The apparatus of claim 7, wherein a magnetic medium is passed over the linear array of transducers.

9. The apparatus of claim 8, wherein the magnetic medium includes a tape medium.

10. The apparatus of claim 9, wherein the tape medium includes a plurality of data bands.

11. The apparatus of claim 7, wherein the linear array of transducers includes a linear array of read elements.

12. The apparatus of claim 11, wherein all of the read elements utilize a common analog-to-digital converter (ADC) clock.

* * * * *